(12) United States Patent
Nagasawa et al.

(10) Patent No.: US 8,553,372 B2
(45) Date of Patent: Oct. 8, 2013

(54) MAGNETIC OSCILLATOR

(75) Inventors: Tazumi Nagasawa, Yokohama (JP); Kiwamu Kudo, Kamakura (JP); Rie Sato, Yokohama (JP); Koichi Mizushima, Kamakura (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 13/430,074

(22) Filed: Mar. 26, 2012

(65) Prior Publication Data
US 2012/0218667 A1  Aug. 30, 2012

Related U.S. Application Data

(63) Continuation of application No. PCT/US2009/066970, filed on Sep. 29, 2009.

(51) Int. Cl.
*G11B 5/39* (2006.01)

(52) U.S. Cl.
USPC ........................................................ 360/324.2

(58) Field of Classification Search
USPC .................. 360/324.2, 324.12, 324.11, 324.1
See application file for complete search history.

(56) References Cited

U.S. PATENT DOCUMENTS

| | | | | |
|---|---|---|---|---|
| 5,966,012 A * | 10/1999 | Parkin | ........................... | 324/252 |
| 6,005,753 A * | 12/1999 | Fontana et al. | ............ | 360/324.2 |
| 7,602,588 B2 | 10/2009 | Sato et al. | | |
| 7,667,933 B2 | 2/2010 | Kudo et al. | | |
| 8,063,709 B2 * | 11/2011 | Firastrau et al. | ............. | 331/94.1 |
| 8,198,919 B1 * | 6/2012 | Kozhanov et al. | ............ | 326/104 |
| 2002/0114111 A1 * | 8/2002 | Zhu | ............................. | 360/324.1 |
| 2002/0149886 A1 * | 10/2002 | Gill | ............................. | 360/317 |
| 2006/0056114 A1 * | 3/2006 | Fukumoto et al. | ......... | 360/324.2 |
| 2009/0201614 A1 | 8/2009 | Kudo et al. | | |
| 2010/0039181 A1 * | 2/2010 | Firastrau et al. | ............. | 331/94.1 |
| 2011/0007431 A1 * | 1/2011 | Braganca et al. | ........ | 360/324.12 |
| 2012/0154063 A1 * | 6/2012 | Nikonov et al. | ............. | 331/94.1 |

FOREIGN PATENT DOCUMENTS

| | | |
|---|---|---|
| JP | 2006-286855 A | 10/2006 |
| JP | 2006-295908 A | 10/2006 |
| JP | 2008-311373 A | 12/2008 |
| JP | 2009-135471 A | 6/2009 |
| JP | 2009-194070 A | 8/2009 |

OTHER PUBLICATIONS

Kaka, et al; "Mutual Phase-Locking of Microwave Spin Torque Nano-Oscillators"; Nature Letters; vol. 437, Sep. 15, 2005; doi:10.1038/nature04035; pp. 389-392.

(Continued)

*Primary Examiner* — Allen T Cao
(74) *Attorney, Agent, or Firm* — Ohlandt, Greeley, Ruggiero & Perle, L.L.P.

(57) ABSTRACT

According to one embodiment, a magnetic oscillator includes a layered film and a pair of electrodes. The layered film includes a first ferromagnetic layer, an insulating layer stacked on the first ferromagnetic layer, and a second ferromagnetic layer stacked on the insulating layer. The pair of electrodes is configured to apply a current to the layered film in a direction perpendicular to a film surface of the layered film. Regions having different resistance area products are provided between the first ferromagnetic layer and the second ferromagnetic layer.

16 Claims, 4 Drawing Sheets

(56) References Cited

OTHER PUBLICATIONS

Rippard, et al.; "Current-Driven Microwave Dynamics in Magnetic Point Contacts as a Function of Applied Field Angle"; Sep. 27, 2004; Physical Review B 70, 100406(R); Rapid Communications; pp. 100406-1-100406-4.

Kiselev; et al.; "Microwave Oscillations of a Nanomagnet Driven by a Spin-Polarized Current"; Nature, vol. 425, Sep. 25, 2003; pp. 380-383.

International Search Report dated Dec. 22, 2009 from PCT/JP2009/066970.

* cited by examiner

MAGNETIC OSCILLATOR

CROSS REFERENCE TO RELATED APPLICATIONS

This application is a Continuation Application of PCT Application No. PCT/JP2009/066970, filed Sep. 29, 2009, the entire contents of which are incorporated herein by reference.

FIELD

Embodiments described herein relate generally to a magnetic oscillator.

BACKGROUND

It is known that a microwave signal of a steady state, which responds to a direct current, can be generated by using spin transfer effect which occurs in a magnetic multilayer film of nanometer scale (for example, see S. I. Kiselev et al. "Microwave oscillations of a nanomagnet driven by a spin-polarized current" Nature 425, 380 (2003)). The origin of the microwave signal is magnetization oscillation of a magnetization oscillation part in a magnetic multilayer film. In an experiment, in a current-perpendicular-to-plane (CPP) giant-magnetoresistive (GMR) effect film and a magnetic tunnel junction (MTJ) film, when the current density exceeds the order of $10^7$ A/cm$^2$, steady magnetization oscillation of high frequency (GHz) is detected.

Microwave generators using spin transfer effect generated in a magnetic multilayer film are called spin transfer oscillators, magnetic oscillators, and spin transfer oscillators. By a remarkably-advanced fine processing technology, it has become possible to process a CPP-GMR film and a magnetic tunnel junction film in a submicron size of about 100 nm×100 nm. Magnetic oscillators are expected to be applied to minute microwave sources and resonators, and have been actively researched as a research of spintronics. The frequency of a microwave signal generated from a magnetic oscillator depends on a current, and a magnetic field which acts on magnetization of a magnetization oscillation part in a magnetization multilayer film. In particular, by using its magnetic field dependence that the magnetization oscillation frequency changes according to the magnetic field, it has been proposed to apply magnetic oscillators to magnetic sensors for an HDD which replace a GMR head and a TMR head (for example, see JP-A 2006-286855 (KOKAI)). When a magnetic oscillator is used as a magnetic sensor for an HDD, the magnetic field of the HDD medium is sensed by detecting change in frequency caused by the magnetic field.

Conventional magnetic oscillators have a structure in which a microwave signal caused by oscillation of magnetization in a magnetoresistive element having a ferromagnetic multilayer film is taken out. The magnetoresistive element has a three-layer structure including a magnetization free layer, a spacer layer, and a magnetization pinned layer, as a basic structure. When a direct current I flows through the magnetoresistive element by a power supply, the magnetization in the magnetization free layer is oscillated by a spin transfer effect between the magnetization free layer and the magnetization pinned layer, and an angle θ between the magnetization of the magnetization free layer and the magnetization of the magnetization pinned layer changes from moment to moment. With the change of the relative angle θ, the element resistance changes from moment to moment mainly by magnetoresistive effect, and therefore an alternating-current component of the voltage is produced. By extracting the alternating-current component of the voltage by a bias tee, a microwave signal is obtained.

A direct current I generated by a power source is not a desired value, but must be a current value which exceeds a threshold current value Ic that depends on the structure of the magnetoresistive element module including a ferromagnetic multilayer film and the surrounding magnetic field environment. Only when I>Ic is satisfied, magnetization oscillation is induced in the magnetization free layer by the spin transfer effect. The value of the threshold current Ic is determined by a cross section of the magnetoresistive element and a threshold current density value. It is known that the threshold current density value is about $10^7$ A/cm$^2$.

In the meantime, there is a quality (Q) factor as a quantity which indicates a character of the oscillator. As an example of a Q-factor, there is mentioned an oscillating circuit which uses a crystal oscillator as a resonator. It is known that crystal oscillators have a high Q-factor of the order of $10^6$. An oscillating circuit which uses a crystal oscillator as a resonator achieves a Q-factor of the order of $10^3$ to $10^4$, and obtains stable oscillation. The Q-factor is a dimensionless quantity which is defined as follows, and a large Q-factor means that oscillation is stable.

$$Q = \frac{\text{energy stored in 1 period}}{\text{power loss consumed in 1 period (dissipated energy)}}$$

Oscillated state is often recognized by a frequency spectrum thereof, and in such a case the Q-factor is defined by $Q = f0/\Delta f$. The symbol f0 represents an oscillation frequency, and the symbol Δf represents a full width at half maximum of an oscillation peak of the frequency spectrum.

A magnetic oscillator realized by a CPP-GMR film (hereinafter referred to as a "GMR oscillator") is obtained when a spacer layer of the magnetoresistive element is formed of a non-magnetic metal layer such as Cu. It has been known from experiment that oscillation of Q≈(10 GHz/1 MHz) $10^4$ is obtained by a GMR oscillator (for example, see W. H. Rippard et al. "Current-driven microwave dynamics in magnetic point contacts as a function of applied field angle" Physical Review B 70, 100406 (R) (2004)). Specifically, GMR oscillators have performance which is greater than or equal to oscillating circuits which use a crystal oscillator as a resonator, with respect to the Q-factor. The reason why GMR oscillators can achieve a high Q-factor is that a large current can flow through GMR oscillators that are artificial metal lattices, all of which are formed of metal material. It is known that a full width at half maximum Δf of the frequency spectrum is generally in inverse proportion to the square of current I (that is, $\Delta f \propto 1/I^2$). The value of Δf becomes extremely small by flowing a large current, and thus a high Q-factor can be achieved. A high Q-factor is an advantage of GMR oscillators. GMR oscillators have, however, a disadvantage that a single GMR oscillator outputs a weak electric power of the order of nanowatts (nW) at most, which is far from a practical electric power level of microwatts (μW) and is not desirable for application. The reason why a GMR oscillator outputs a weak electric power of the order of nanowatt is that GMR oscillators have a small magnetoresistive (MR) ratio of several percent at most. A structure of increasing an output power by arranging GMR oscillators in an array has been proposed (for example, see S. Kaka et al. "Mutual phase-locking of microwave spin torque nano-oscillators" Nature 437, 389 (2005)). In the case of arranging GMR oscillators in an array, however, it is necessary to arrange at least dozens of GMR oscillators in an array and synchronize all the oscillators with each other, to increase the output power to a microwatt level. Therefore, it is difficult to manufacture the magnetic oscillator.

On the other hand, magnetic oscillators achieved by a magnetic tunnel junction film (hereinafter referred to as "TMR oscillators") are obtained when a tunnel barrier is used as the spacer layer. In recent years, high-quality magnetic tunnel junction films which have low resistance and a high MR ratio have been developed, and expected to be applied to spin injection magnetic random access memories (spin-RAM). In particular, it has been known by experiments that the MR ratio in a TMR (MgO-TMR) film which has a magnesium oxide (MgO) barrier is several hundred percent or more. TMR oscillators can obtain large oscillation power P since they have a high MR ratio. The oscillation power generated by magnetic oscillators using an MgO-TMR film is actually coming near practical microwatt electric power level, and the maximum power level which has been reported at present is 0.16 µW. It is impossible, however, to cause a large current to flow through magnetic oscillators using a magnetic tunnel junction film such as an MgO-TMR film, unlike GMR oscillators, due to the problem of insulation breakage by a tunnel barrier, and thus it is difficult for the oscillators to realize a high Q-factor.

There are many cases where magnetization oscillation cannot be excited in the first place in TMR oscillators. This is also due to insulation breakdown of the tunnel barrier. This is because there are many cases where insulation breakdown is caused by a current which is smaller than the threshold current Ic, although magnetization oscillation is excited in the free layer by the spin transfer effect only when I>Ic is satisfied as described above.

JP-A 2009-194070(KOKAI) discloses a complex magnetic oscillator which is obtained by magnetostatic-coupling an oscillation driving module formed of a GMR oscillator with an output module formed of a TMR oscillator, with good use of characters of GMR oscillators and TMR oscillators. It is necessary, however, to manufacture the two oscillators very close to each other, that is, 300 nm or less, to perform magnetostatic coupling, and thus the manufacturing process is difficult both in a planar structure and a layered structure.

As described above, each of GMR oscillators and TMR oscillators have merits and demerits. The merit of GMR oscillators is a high Q-factor, and the demerit thereof is small oscillation power. The merit of TMR oscillators is large oscillation power, that is, high output power, and the demerit thereof is a low Q-factor.

Therefore, it is required for magnetic oscillators to have the advantages of GMR oscillators and TMR oscillators, that is, a high Q-factor and high output power.

DETAILED DESCRIPTION

In general, according to one embodiment, a magnetic oscillator includes a layered film and a pair of electrodes. The layered film includes a first ferromagnetic layer, an insulating layer stacked on the first ferromagnetic layer, and a second ferromagnetic layer stacked on the insulating layer. The pair of electrodes is configured to apply a current to the layered film in a direction perpendicular to a film surface of the layered film. Regions having different resistance area products are provided between the first ferromagnetic layer and the second ferromagnetic layer.

The embodiment provides a magnetic oscillator of high Q-factor and high output power. The magnetic oscillator of the embodiment can be used for a microwave source, a resonator, and a magnetic sensor or the like.

Magnetic oscillators according to embodiments will be explained hereinafter with reference to the accompanying drawings. In the embodiments, like reference numbers denote like elements, and duplication of explanation will be avoided. Each drawing is a schematic diagram, and the illustrated shape, dimension and ratio include parts different from those of the actual oscillator. When the oscillator is actually manufactured, they can be properly changed in consideration of the following explanation and publicly known art.

Figure 1:
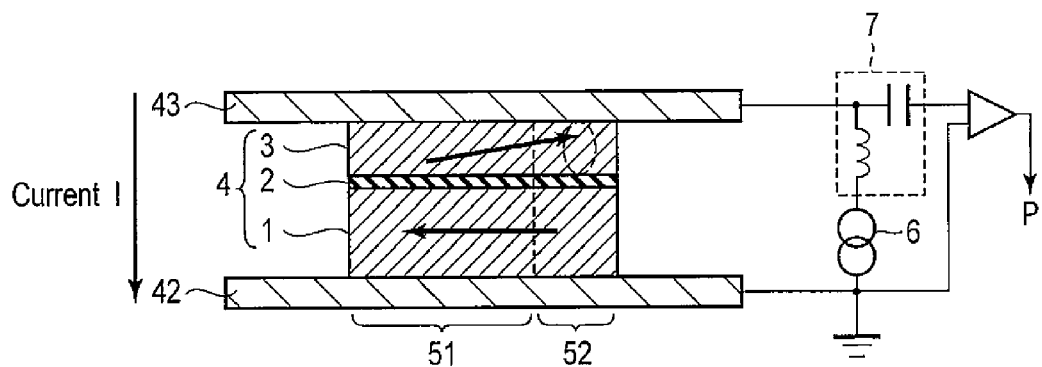
FIG. 1 is a schematic diagram of a magnetic oscillator according to embodiments.

FIG. 1 illustrates a schematic structure of a magnetic oscillator according to one embodiment. As illustrated in FIG. 1, the magnetic oscillator is formed to have a layered structure obtained by successively stacking a first ferromagnetic layer 1, an insulating layer (also referred to as tunnel barrier layer) 2, and a second ferromagnetic layer 3. Although, in FIG. 1, the first ferromagnetic layer 1 is a magnetization pinned layer whose magnetization is fixed and the second ferromagnetic layer 3 is a magnetization free layer whose magnetization is not fixed, the structure is not limited to it. As one example, the first ferromagnetic layer 1 may be a magnetization free layer, and the second ferromagnetic layer 3 may be a magnetization pinned layer. Alternatively, both of the first and second ferromagnetic layers 1 and 3 may be a magnetization free layer. In a magnetization free layer, direction of magnetization is changed in accordance with the external magnetic field. In addition, in the example illustrated in FIG. 1, the magnetization of the second ferromagnetic layer 3 is maintained by the external magnetic field in a direction which is antiparallel with the direction of the magnetization of the first ferromagnetic layer 1, to easily generate magnetization oscillation caused by the spin transfer effect. The following explanation mainly shows the example in which the first ferromagnetic layer 1 illustrated in FIG. 1 is a magnetization pinned layer, and the second ferromagnetic layer 3 is a magnetization free layer.

The first and second ferromagnetic layers 1 and 3 are formed of Co, Ni, or Fe, or alloy which includes at least one of them. At both end parts of at least one of the first and second ferromagnetic layers 1 and 3, a pair of bias magnetization films may be provided which apply a bias magnetic field. One of the first and second ferromagnetic layers 1 and 3 may be an exchange coupled film which is obtained by stacking a ferromagnetic layer which has in-plane magnetic anisotropy and an antiferromagnetic layer. Alternatively, one of the first and second ferromagnetic layers 1 and 3 may be an exchange coupled film which is obtained by stacking a ferromagnetic layer which has in-plane magnetic anisotropy, a nonmagnetic intermediate layer which controls the magnitude of the bias magnetic field, and an antiferromagnetic layer. Alternatively, one of the first and second ferromagnetic layers 1 and 3 may be an exchange coupled film which is obtained by stacking an artificial ferrimagnetic film which has in-plane magnetic anisotropy and an antiferromagnetic layer.

The insulating layer 2 is formed of magnesium oxide (MgO) film, aluminum oxide (AlO) film, or the like. A magnetic oscillator using MgO film as the insulating layer 2 has a large magnetoresistive (MR) ratio, and thus can obtain high output power.

The magnetic oscillator illustrated in FIG. 1 includes a pair of electrodes, that is, a lower electrode 42 and an upper electrode 43, which apply a direct current I to a layered film 4 including the first ferromagnetic layer 1, the insulating layer 2, and the second ferromagnetic layer 3, in a direction perpendicular to a film surface of the layered film 4. The direction corresponds to a stacking direction in the layers 1, 2, and 3 are stacked. The direct current I is supplied from a power supply 6. The direct current I flows in a direction perpendicular to the film surface of the layered film 4, that is, from the second ferromagnetic layer 3 to the first ferromagnetic layer 1 through the insulating layer 2. The intensity of a tunnel current which flows through the insulating layer 2 depends on an angle between the magnetization of the first ferromagnetic layer 1 and the magnetization of the second ferromagnetic layer 3. When the direct current I flows through the layered film 4, the magnetization in the second ferromagnetic layer 3 is steadily oscillated by the spin transfer effect between the first and second ferromagnetic layers 1 and 3. More specifically, when the direct current I flows from the second ferromagnetic layer 3 toward the first ferromagnetic layer 1, electrons flow from the first ferromagnetic layer 1 toward the second ferromagnetic layer 3, and electrons which are spin-polarized by the magnetization of the first ferromagnetic layer 1 are injected into the second ferromagnetic layer 3. Then, the spin-polarized electrons act on the magnetization of the second ferromagnetic layer 3, and precession of the magnetization of the second ferromagnetic layer 3 is induced.

In the case where both the first and second ferromagnetic layers 1 and 3 are magnetization free layers, when the direct current I flows through the layered film 4, precession of the magnetizations of the first and second ferromagnetic layers 1 and 3 is induced with a fixed difference in phase between them.

The steady oscillation of the magnetization of the second ferromagnetic layer 3 becomes voltage oscillation by the magnetoresistive effect. More specifically, when the magnetization of the second ferromagnetic layer 3 is oscillated by supply of the direct current I, the relative angle between the magnetization of the first ferromagnetic layer 1 and the magnetization of the second ferromagnetic layer 3 changes from moment to moment. With change of the relative angle, the resistance of the oscillator changes from moment to moment mainly due to the magnetoresistive effect. Consequently, an alternating-current component is produced in a voltage between the lower electrode 42 and the upper electrode 43. The alternating-current component of the voltage is extracted by a bias tee 7 which is formed of a capacitor and an inductance, and a microwave signal (also referred to as a high-frequency voltage) P is obtained as output. The number of vibrations of the high-frequency voltage is equivalent to the number of vibrations of the magnetization oscillation, and depends on the size and thickness of the magnetization free layer, the direct current, and the magnitude of the external magnetic field. The thickness is defined in the stacking direction. When the magnetic oscillator illustrated in FIG. 1 is used for a magnetic recording and reproducing apparatus explained later, the magnetic oscillator can detect continuous change of the number of vibrations (that is, frequency) of the high-frequency voltage in accordance with the magnetic field from the recording bits of the rotated magnetic disk, and read out information of the recording bits.

To induce magnetization oscillation, it is necessary that the direct current I from the power supply 6 has a current value which exceeds a threshold current Ic (that is, I>Ic). The threshold current Ic depends on the structure of the layered film 4 and the surrounding magnetic field environment. The threshold current Ic is determined by the threshold current density and a cross section of the layered film 4, in a plane which is perpendicular to the stacking direction. Therefore, generally, to oscillate the magnetization, it is a necessary condition that a current density J in the layered film 4 exceeds a threshold current density Jc.

The magnetic oscillator illustrated in FIG. 1 includes a region 51 which has a high resistance area product (RA) (hereinafter referred to as a "high RA region"), and a region 52 which has low resistance area product (hereinafter referred to as a "low RA region"), between the first and second ferromagnetic layers 1 and 3. The term "resistance area product" indicates a resistance per unit area (for example, 1 μm$^2$) in a plane perpendicular to the direction of flow of the current. The resistance area product of the high RA region 51 is denoted by RA1, and the resistance area product of the low RA region 52 is denoted by RA2. RA1 is higher than RA2. When a constant current I is supplied to the magnetic oscillator which includes the high RA region 51 and the low RA region 52, a voltage between the first and second ferromagnetic layers 1 and 3 is fixed, and thus the ratio of the current density of the current which flows through the low RA region 52 to the current density of the current which flows through the high RA region 51 is determined by the ratio of RA of the region 52 to RA of the region 51. Specifically, a current density J2 in the low RA region 52 is (RA1/RA2) times as large as a current density J1 in the high RA region 51. In such a case, a current of high current density flows through the low RA region 52, and the magnetization of the second ferromagnetic layer 3 is strongly excited. Since the second ferromagnetic layer 3 extends over the low RA region 52 and the high RA region 51, the magnetization of the high RA region 51 is excited by spin waves, and magnetization oscillation which is larger than that caused by excitation of the magnetization oscillation by spin torque in the current density J1 is excited in the high RA region 51. Specifically, in the second ferromagnetic layer 3, the magnetization of the low RA region 52 is strongly excited, oscillation of the magnetization of the low RA region 52 is transmitted to the magnetization of the high RA region 51 by exchange interaction, and the magnetization of the high RA region 51 is strongly excited. As a result, large change in resistance is generated, and high output power is obtained. In an extreme case, even when the current density does not exceed the threshold in the high RA region 51, the magnetic oscillator according to the present embodiment can oscillate the magnetization of the second ferromagnetic layer 3 and obtain high output power, as long as a current density of the threshold value or more is achieved in the low RA region 52.

A resistance R1 of the high RA region 51 is represented by the expression R1=RA1/S1, by using an area S1 of the high RA region 51 and the resistance area product RA1 of the high RA region 51. In the same manner, a resistance R2 of the low RA region 52 is represented by the expression R2=RA2/S2, by using an area S2 of the low RA region 52 and the resistance area product RA2 of the low RA region 52. A resistance R between the first and second ferromagnetic layers 1 and 3 is represented by the expression R=(R1×R2)/(R1+R2), and a voltage V is represented by the expression V=I×(R1×R2)/(R1+R2). In addition, as described above, the current density J2 in the low RA region 52 is (RA1/RA2) times as large as the current density J1 in the high RA region 51. Therefore, as the difference between the resistance area products RA1 and RA2 increase and the area of the low RA region 52 decreases, the current density of the current which flows through the low RA region 52 increases, and the magnetization of the second ferromagnetic layer 3 is oscillated more strongly. As described above, the magnetic oscillator illustrated in FIG. 1 can realize high output power and a high Q-factor, by achieving a partly large current density in the layered film 4 having a high MR ratio.

First Embodiment

A magnetic oscillator according to a first embodiment will be explained hereinafter with reference to FIG. 2 and FIG. 3.

Figure 2:
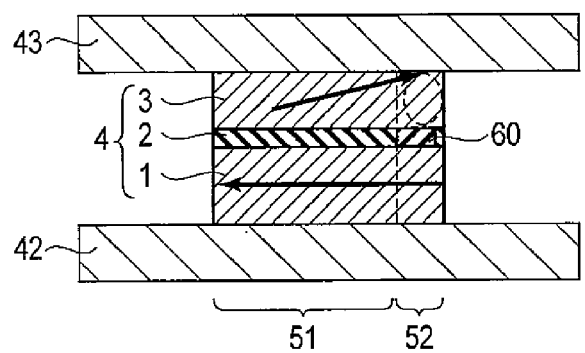
FIG. 2 is a cross-sectional view illustrating a magnetic oscillator according to a first embodiment.
Figure 3:
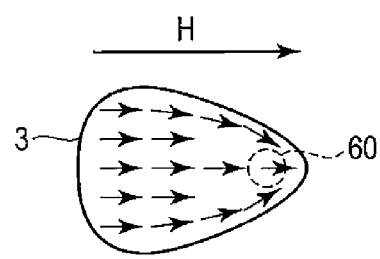
FIG. 3 is a cross-sectional view illustrating a planar shape of the magnetic oscillator illustrated in FIG. 1.

FIG. 2 illustrates a schematic structure of the magnetic oscillator according to the first embodiment, and FIG. 3 illustrates a planar shape of a layered film 4 illustrated in FIG. 2, as viewed from the stacking direction. The magnetic oscillator illustrated in FIG. 2 includes a layered film 4 including a first ferromagnetic layer 1, a second ferromagnetic layer 3, and an insulating layer 2 that is interposed between the ferromagnetic layers 1 and 3, like the magnetic oscillator illustrated in FIG. 1. The first and second ferromagnetic layers 1 and 3 and the insulating layer 2 have the same planar shape, and form the layered film 4. In the first embodiment, magnetization of the second ferromagnetic layer 3 is controlled by applying an external magnetic field H, such that the magnetization of the second ferromagnetic layer 3 is antiparallel with a direction of magnetization of the first ferromagnetic layer 1. As illustrated in FIG. 3, a cross sectional shape (or a planar shape) of the layered film 4 in a plane perpendicular to a stacking direction, is formed such that the cross sectional shape has at least one edge having a large curvature or the cross sectional shape is tapered as it goes toward a direction opposite to the direction of the magnetization of the first ferromagnetic layer 1. For example, the cross sectional shape of the layered film 4 is formed in a shape obtained by replacing sides and vertices of an acute-angled isosceles triangle with curves. When the external magnetic field H is applied such that the magnetization of the second ferromagnetic layer 3 is directed to the edge having a large curvature, the magnetization around the vertex is more stabilized in a direction running along the edge than in a direction of the external magnetic field, and thus the magnetization is warped by the effect of the shape. FIG. 3 schematically illustrates spatial distribution of the magnetization in the second ferromagnetic layer 3 by arrows.

When the magnetization of the first ferromagnetic layer 1 is fixed to be antiparallel with the magnetization of the second ferromagnetic layer 3, the resistance area product RA is reduced due to the MR effect, in the region where the magnetization of the second ferromagnetic layer 3 is locally warped. When a direct current I flows through the layered film 4, a low RA region 52 which has a low resistance area product has a locally high current density. When the magnetic oscillator is manufactured with an insulating layer 2 having a very small thickness of 1 nm or less and a large current is supplied to the magnetic oscillator for a long time with a voltage which does not exceed an insulation breakdown voltage, a very small leak path 60 is formed in the low RA region 52 by electromigration and soft breakdown. Although a resistance area product RA in the leak path 60 is at least a digit smaller than the resistance area product in the insulating layer 2, the leak path 60 has a very small area of several square nanometers and has high resistance. Therefore, most of the current flows through a high RA region 51 other than the leak path 60, and the MR ratio of the whole magnetic oscillator is reduced. However, the MR ratio of the whole magnetic oscillator is maintained at few score percent, which is a very high value in comparison with that of GMR elements. Since a current of a current density which is at least a digit higher than that in other regions flows through the leak path 60, the magnetization of the second ferromagnetic layer 3 is very strongly excited and oscillated around the leak path 60. Therefore, a high Q-factor is achieved in the magnetic oscillator. In addition, the magnetic oscillator can obtain high output power, since the region other than the leak path 60 generates large resistance change.

Second Embodiment

A magnetic oscillator according to a second embodiment will be explained hereinafter with reference to FIG. 4.

Figure 4:
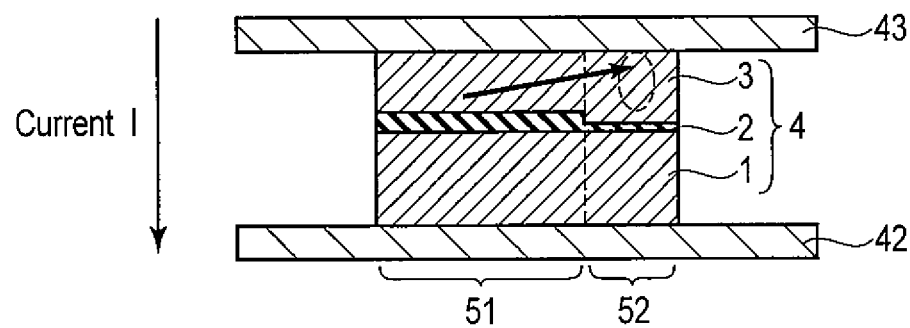
FIG. 4 is a cross-sectional view illustrating a magnetic oscillator according to a second embodiment.

FIG. 4 illustrates a schematic structure of the magnetic oscillator according to the second embodiment. In the magnetic oscillator illustrated in FIG. 4, an insulating layer 2 which is interposed between first and second ferromagnetic layers 1 and 3 has different in-plane thicknesses. Since resistance (tunnel resistance) of an insulating layer 4 changes according to the thickness of the insulating layer 2, the magnetic oscillator has regions which have different resistance area products in a plane between the first and second ferromagnetic layers 1 and 3, in the magnetic oscillator having the above structure. When a current of high current density flows through a low RA region 52, and magnetization of the second ferromagnetic layer 3 in the low RA region 52 is strongly oscillated. Oscillation of the magnetization in the low RA region 52 is transmitted to a high RA region 51 by exchange interaction, magnetization of the high RA region 51 is also strongly oscillated, and consequently large resistance change is generated. Therefore, the magnetic oscillator according to the second embodiment can obtain a high Q-factor and high output power.

Third Embodiment

A magnetic oscillator according to a third embodiment will be explained hereinafter with reference to FIG. 5.

Figure 5:
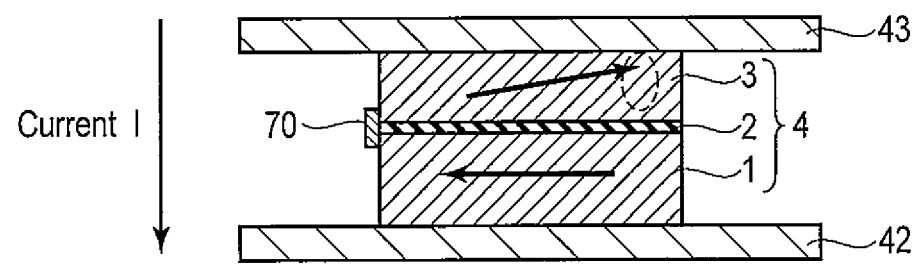
FIG. 5 is a cross-sectional view illustrating a magnetic oscillator according to a third embodiment.

FIG. 5 illustrates a schematic structure of the magnetic oscillator according to the third embodiment. As illustrated in FIG. 5, the magnetic oscillator includes a metal path 70, which electrically connects first and second ferromagnetic layers 1 and 3, on a sidewall of a layered film. Fine processing of the magnetic film is generally performed by ion milling. It is possible to adhere removed atoms again to the processed cross section, by changing processing conditions such as an ion acceleration voltage and an ion incident angle. After the oscillator is isolated by ion milling under conditions in which atoms are not adhered, ion milling is performed from a specific direction with respect to the oscillator under conditions in which atoms are adhered again, and thereby a minute metal path 70 which electrically connects the first and second ferromagnetic layers 1 and 3 can be formed on part of the sidewall of the oscillator. Specifically, the first and second ferromagnetic layers 1 and 3 are connected to each other via an insulating layer 2 which has high resistance area product and the metal path 70 which has low resistance area product. Therefore, it is possible to obtain a high Q-factor and high output power in the third embodiment, like the first and second embodiments.

Example 1

Figure 6:
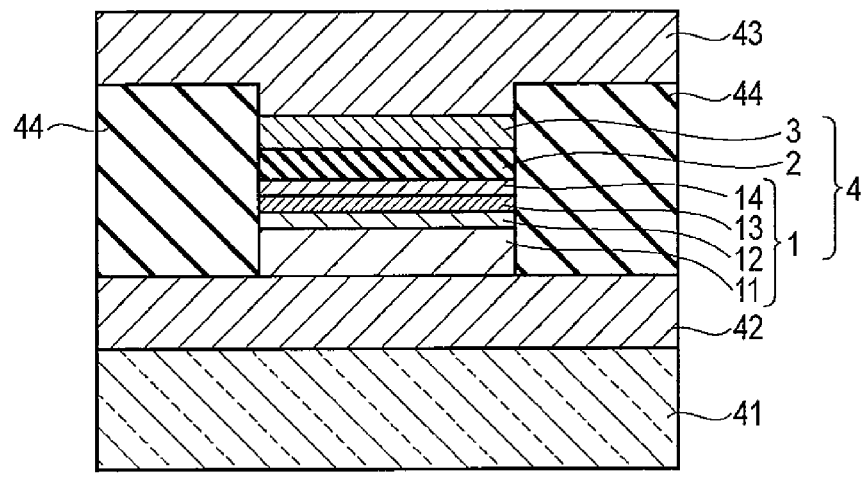
FIG. 6 is a cross-sectional view illustrating a magnetic oscillator according to Example 1.

FIG. 6 is a cross-sectional view of a magnetic oscillator according to Example 1, which corresponds to the first embodiment. As illustrated in FIG. 6, the magnetic oscillator was obtained by forming layers on a glass substrate 41 by using a sputtering device, forming an upper electrode 43 and a lower electrode 42 by photolithography and ion milling, and processing a layered film 4 by electron-beam lithography and ion milling.

The first ferromagnetic layer 1 was formed of an exchange bias film which is obtained by stacking an antiferromagnetic layer 11 formed of IrMn and an artificial ferri-structure in which an intermediate layer 13 formed of Ru is interposed between a ferromagnetic layer 12 formed of CoFe and a ferromagnetic layer 14 formed of CoFeB, and has fixed magnetization. An insulating layer 2 was formed of MgO, and a second ferromagnetic layer 3 was formed of CoFeB. A lower electrode 42 was formed of Ta/Cu/Ta, an upper electrode 43 was formed of Au/Cu, and an insulator 44 was formed of $SiO_2$. When a current flows through the magnetic oscillator having the above structure, precession of magnetization of CoFeB being the second ferromagnetic layer 3 is induced.

In the magnetic oscillator illustrated in FIG. 6, a layered film 4 was processed to have a cross section shape which is tapered toward an edge as illustrated in FIG. 3. An external magnetic field 500 Oe was applied to the layered film 4 in a direction toward the tapered edge (magnetization of the first ferromagnetic layer was fixed to be antiparallel), a current was supplied to the layered film, and thereby a leak path as illustrated in FIG. 2 was formed in the insulating layer 2. By forming the leak path in the insulating film 2, the resistance of the oscillator was reduced, and the MR ratio thereof was reduced to 63%.

A lead of the upper electrode 43 and a lead of the lower electrode 42 of the magnetic oscillator were designed to serve as coplanar guide (waveguide) having a characteristic impedance of 50Ω.

Figure 7:
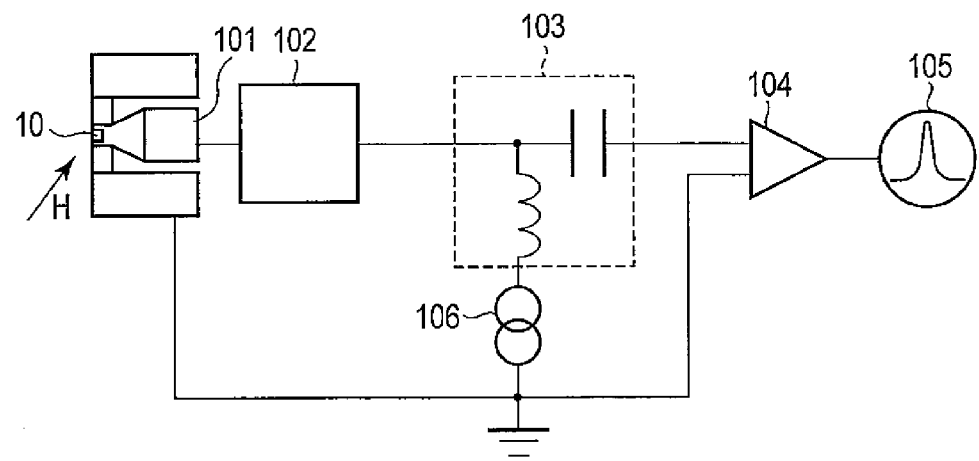
FIG. 7 is a schematic diagram illustrating a power spectrum measurement system in the magnetic oscillator illustrated in FIG. 6.

FIG. 7 illustrates a measurement system for oscillation power spectrum in the magnetic oscillator. As illustrated in FIG. 7, in the measurement system, a bias tee 103 is connected to a waveguide 101, which transmits high-frequency oscillation from a magnetic oscillator 10, through a high-frequency probe 102, an input end of an amplifier 104 is connected to an output end of the bias tee 103, and a spectrum analyzer 105 is connected to an output end of the amplifier 104. In addition, a direct-current power supply 106 is connected to the bias tee 102.

Before explanation of a measurement result of oscillation characteristics of the magnetic oscillator in the above Example 1, oscillation characteristics of a TMR oscillator in prior art will be explained hereinafter as Comparative Example 1. Although the TMR oscillator according to the Comparative Example 1 is manufactured with the same structure as that of the layered film illustrated in FIG. 6, the oscillator is processed to have an ellipsoidal planar shape (with a size of about 60 nm×120 nm). The TMR oscillator has a resistance area product RA of 12 $\Omega\mu m^2$, and an MR ratio of 130%. In measurement of oscillation characteristics of the TMR oscillator of Comparative Example 1, an external magnetic field of 300 Oe was applied to the TMR oscillator in a direction which is inclined by 10° from a direction in which magnetization of the first ferromagnetic layer and magnetization of the second ferromagnetic layer are antiparallel with each other, and direct current was made flow from the second ferromagnetic layer to the first ferromagnetic layer. When the current was gradually increased under the above condition, spin torque increased together with increase in current, and thus the full width at half maximum of the oscillation peak decreased. When a current having a current density of $4.0\times10^6$ $A/cm^2$ was supplied, however, the full width at half maximum was only reduced to about 300 MHz. On the other hand, when a current was made flow through the magnetic oscillator according to Example 1, the full width at half maximum was 84 MHz with a current density of $1\times10^6$ $A/cm^2$, and oscillation peak having a full width at half maximum that does not exceed 100 MHz was recognized. The peak frequency f was about 3 GHz in both of the oscillators. In the magnetic oscillator in which a leak path is formed in the insulating layer 2 locally has high current density, and has small full width at half maximum Δf, although it has small average current density. Therefore, the magnetic oscillator has a high Q-factor which is defined by Q=f0/Δf.

Example 2

In a magnetic oscillator according to Example 2, which corresponds to the third embodiment, a TMR film was manufactured by the same process as that explained in Example 1, and the film was processed such that the oscillator had an ellipsoidal cross section shape (or an ellipsoidal planar shape) of about 110 nm×150 nm. The TMR film had an RA of 14 $\Omega\mu m^2$, and an MR ratio of 110%. Next, the TMR film was overetched by ion milling, and thereby an oscillator including a metal path was manufactured by re-adhesion of metal on a sidewall. The manufactured oscillator had a resistance area product RA of about 5.2 $\Omega\mu m^2$, and an MR ratio of 10%. When an external magnetic field of 330 Oe was applied to the oscillator in a direction of an easy axis (which is almost antiparallel with the first ferromagnetic layer 1) of the second ferromagnetic layer 3 to supply a current having a current density of $4.2\times10^6$ $A/cm^2$, an oscillation peak was recognized around a frequency of 4.4 GHz, and an output power of 310 pW was obtained with a line width of 24 MHz. As the magnetic oscillator according to Comparative Example 2, a non-shorted oval oscillator which has a size of about 60 nm×120 nm and manufactured by using a TMR film having an RA of 12 $\Omega\mu m^2$ and an MR ratio of 130%. When an external magnetic field of 300 Oe was applied to the magnetic oscillator of Comparative Example 2 in a direction that is inclined by 10° from the easy axis to supply a current having a current density of $4.0\times10^6$ $A/cm^2$, the full width at half maximum in the frequency peak was about 300 MHz, the output power was 120 pW. An oscillator which includes a short path (metal path) has smaller line width, that is, a higher Q-factor, since it is strongly oscillated, although it has a lower MR ratio. Therefore, the oscillator with a short path can obtain higher output power.

Next, a magnetic recording and reproducing apparatus according to an embodiment will be explained hereinafter with reference to FIG. 8 and FIG. 9.

Figure 8:
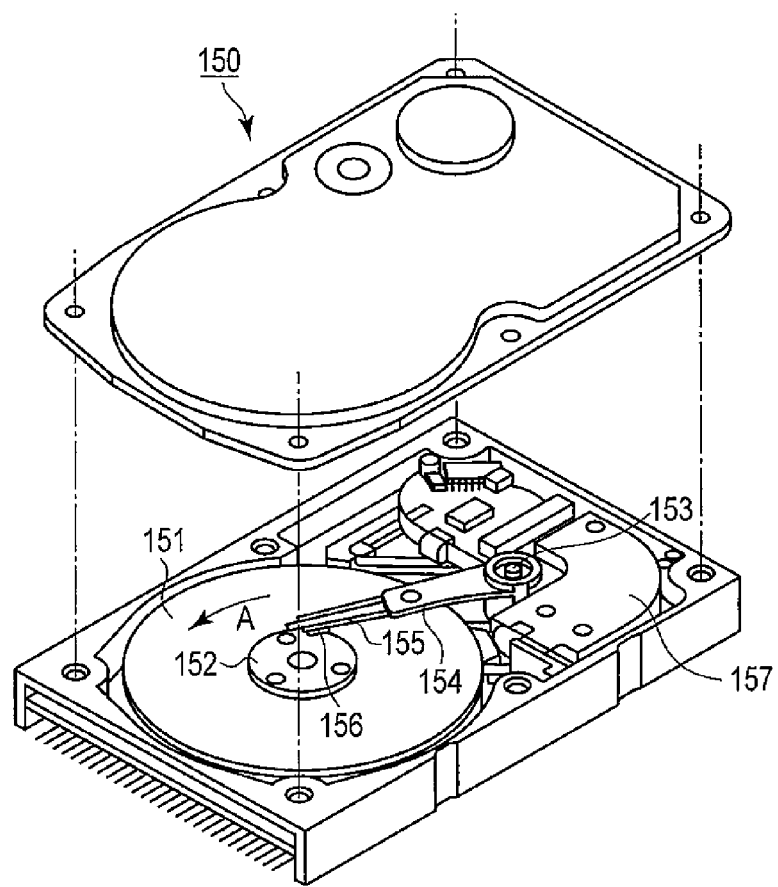
FIG. 8 is a perspective view of a magnetic recording and reproducing apparatus according to the embodiments.

FIG. 8 illustrates a schematic structure of a magnetic recording and reproducing apparatus 150 according to the embodiment. As illustrated in FIG. 8, the magnetic recording and reproducing apparatus 150 comprises a magnetic disk (magnetic recording medium) 151. The magnetic disk 151 is rotated in a direction of arrow A by a spindle motor that is attached to a spindle 152. An actuator arm 154 is held by a pivot 153 which is provided near the magnetic disk 151. A suspension 155 is attached to a distal end of the actuator arm 154. A head slider 156 is supported on a lower surface of the suspension 155. The head slider 153 is provided with a magnetic head which includes one of the magnetic oscillators that are explained with reference to FIG. 1 to FIG. 5. A voice coil motor 157 is formed in a proximal end part of the actuator arm 154.

When the magnetic disk 151 is rotated, the actuator arm 154 is rotated by the voice coil motor 157 and the head slider 156 is loaded onto the magnetic disk 151, an air bearing surface (ABS) of the head slider 156 provided with the magnetic head is held with a predetermined floating quantity from the surface of the magnetic disk 151. In this state, information recorded on the magnetic disk 151 can be read out.

The head slider 156 may be of a contact motion type in which the slider contacts the magnetic disk 151.

Figure 9:
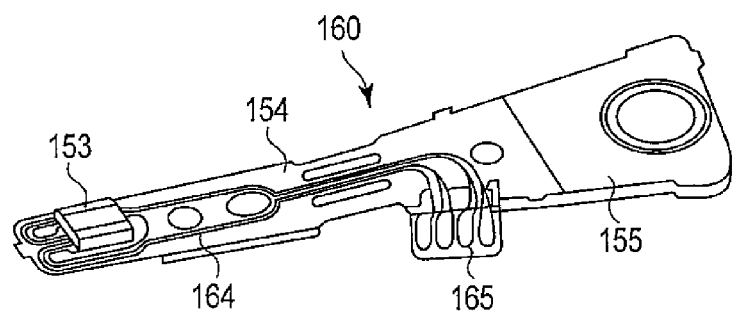
FIG. 9 is a perspective view of a magnetic head assembly illustrated in FIG. 8, as viewed from the magnetic disk side.

FIG. 9 is an enlarged perspective view of a magnetic head assembly which includes the actuator arm 154 and a distal end part, as viewed from the magnetic disk side. A magnetic head assembly 160 includes an actuator arm 155, and the suspension 154 is connected to one end of the actuator arm 155. A head slider 153 which has the magnetic head including one of the magnetic oscillators explained with reference to FIG. 1 to FIG. 5 is attached to a distal end of the suspension 154. A lead line for writing and reading signals is drawn in the suspension 154, and the lead line 164 is electrically connected to each electrode of the magnetic head incorporated in the head slider 153. The lead line 164 is connected to an electrode pad 165 of the magnetic head assembly 160.

According to the magnetic reproducing apparatus of the embodiment, it is possible to read information that is magnetically recorded on the magnetic disk 151 with a high recording density, by the magnetic head including one of the magnetic oscillators explained with reference to FIG. 1 to FIG. 5.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic oscillator comprising:
    a layered film comprising a first ferromagnetic layer, an insulating layer stacked on the first ferromagnetic layer, and a second ferromagnetic layer stacked on the insulating layer; and
    a pair of electrodes configured to apply a current to the layered film in a direction perpendicular to a film surface of the layered film;
    wherein regions having different resistance area products are provided between the first ferromagnetic layer and the second ferromagnetic layer, wherein each of the first ferromagnetic layer, the insulating layer, the second ferromagnetic layer has a cross sectional shape taken along a plane perpendicular to a stacking direction, the cross sectional shape being tapered toward an end part, and the insulating layer is provided with a leak path in the end part, the leak path having a smaller resistance area product than a resistance area product of the insulating layer.

2. The oscillator according to claim 1, wherein the insulating layer includes the regions having different thicknesses.

3. The oscillator according to claim 1, further comprising a metal path which electrically connects the first ferromagnetic layer and the second ferromagnetic layer.

4. A magnetic recording and reproducing apparatus comprising:
    a magnetic oscillator comprising a layered film and a pair of electrodes, the layered film comprising a first ferromagnetic layer, an insulating layer stacked on the first ferromagnetic layer, and a second ferromagnetic layer stacked on the insulating layer, the pair of electrodes configured to apply a current to the layered film in a direction perpendicular to a film surface of the layered film,
    wherein regions having different resistance area products are provided between the first ferromagnetic layer and the second ferromagnetic layer, and wherein
    each of the first ferromagnetic layer, the insulating layer, the second ferromagnetic layer has a cross sectional shape taken along a plane perpendicular to a stacking direction, the cross sectional shape being tapered toward an end part, and
    the insulating layer is provided with a leak path in the end part, the leak path having a smaller resistance area product than a resistance area product of the insulating layer.

5. The apparatus according to claim 4, wherein the insulating layer includes the regions having different thicknesses.

6. The apparatus according to claim 4, further comprising a metal path which electrically connects the first ferromagnetic layer and the second ferromagnetic layer.

7. A magnetic oscillator comprising:
    a layered film comprising a first ferromagnetic layer, an insulating layer stacked on the first ferromagnetic layer, and a second ferromagnetic layer stacked on the insulating layer; and
    a pair of electrodes configured to apply a current to the layered film in a direction perpendicular to a film surface of the layered film;
    wherein regions having different resistance area products are provided between the first ferromagnetic layer and the second ferromagnetic layer,
    wherein the insulating layer includes the regions having different thicknesses, and
    wherein an end part of the insulating layer has a greater thickness than another part of the insulating layer.

8. The oscillator according to claim 7, further comprising a metal path which electrically connects the first ferromagnetic layer and the second ferromagnetic layer.

9. A magnetic recording and reproducing apparatus comprising:
    a magnetic oscillator comprising a layered film and a pair of electrodes, the layered film comprising a first ferromagnetic layer, an insulating layer stacked on the first ferromagnetic layer, and a second ferromagnetic layer stacked on the insulating layer, the pair of electrodes configured to apply a current to the layered film in a direction perpendicular to a film surface of the layered film,
    wherein regions having different resistance area products are provided between the first ferromagnetic layer and the second ferromagnetic layer,
    wherein the insulating layer includes the regions having different thicknesses, and
    wherein an end part of the insulating layer has a greater thickness than another part of the insulating layer.

10. The apparatus according to claim 9, further comprising a metal path which electrically connects the first ferromagnetic layer and the second ferromagnetic layer.

11. A magnetic oscillator comprising:
- a layered film comprising a first ferromagnetic layer, an insulating layer stacked on the first ferromagnetic layer, and a second ferromagnetic layer stacked on the insulating layer; and
- a pair of electrodes configured to apply a current to the layered film in a direction perpendicular to a film surface of the layered film;
- wherein regions having different resistance area products are provided between the first ferromagnetic layer and the second ferromagnetic layer, and
- wherein the resistance area products comprise a resistance per unit area in a plane perpendicular to a direction of flow of current.

12. The oscillator according to claim 11, wherein the insulating layer includes the regions having different thicknesses.

13. The oscillator according to claim 11, further comprising a metal path which electrically connects the first ferromagnetic layer and the second ferromagnetic layer.

14. A magnetic recording and reproducing apparatus comprising:
- a magnetic oscillator comprising a layered film and a pair of electrodes, the layered film comprising a first ferromagnetic layer, an insulating layer stacked on the first ferromagnetic layer, and a second ferromagnetic layer stacked on the insulating layer, the pair of electrodes configured to apply a current to the layered film in a direction perpendicular to a film surface of the layered film,
- wherein regions having different resistance area products are provided between the first ferromagnetic layer and the second ferromagnetic layer, and
- wherein the resistance area products comprise a resistance per unit area in a plane perpendicular to a direction of flow of current.

15. The apparatus according to claim 14, wherein the insulating layer includes the regions having different thicknesses.

16. The apparatus according to claim 14, further comprising a metal path which electrically connects the first ferromagnetic layer and the second ferromagnetic layer.

* * * * *

UNITED STATES PATENT AND TRADEMARK OFFICE
CERTIFICATE OF CORRECTION

PATENT NO.        : 8,553,372 B2
APPLICATION NO.   : 13/430074
DATED             : October 8, 2013
INVENTOR(S)       : Nagasawa et al.

Page 1 of 1

It is certified that error appears in the above-identified patent and that said Letters Patent is hereby corrected as shown below:

On the Title Page, under "Related U.S. Application Data":

Item (63) – please correct: "Continuation of application No. PCT/US2009/066970, filed on Sep. 29, 2009" To -- Continuation of application No. PCT/JP2009/066970, filed on Sep. 29, 2009 --.

Signed and Sealed this
Twenty-ninth Day of April, 2014

Michelle K. Lee
*Deputy Director of the United States Patent and Trademark Office*